(12) United States Patent
Park et al.

(10) Patent No.: US 11,828,433 B2
(45) Date of Patent: Nov. 28, 2023

(54) LIGHTING DEVICE

(71) Applicant: LG INNOTEK CO., LTD., Seoul (KR)

(72) Inventors: Hoon Park, Seoul (KR); Dong Il Eom, Seoul (KR); Yu Won Lee, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 1 day.

(21) Appl. No.: 17/630,972

(22) PCT Filed: Jul. 23, 2020

(86) PCT No.: PCT/KR2020/009740
§ 371 (c)(1),
(2) Date: Jan. 28, 2022

(87) PCT Pub. No.: WO2021/020809
PCT Pub. Date: Feb. 4, 2021

(65) Prior Publication Data
US 2022/0268418 A1 Aug. 25, 2022

(30) Foreign Application Priority Data
Aug. 1, 2019 (KR) .......................... 10-2019-0094040

(51) Int. Cl.
*F21S 43/31* (2018.01)
*F21S 43/14* (2018.01)
(Continued)

(52) U.S. Cl.
CPC ............... *F21S 43/31* (2018.01); *F21S 43/14* (2018.01); *F21S 43/15* (2018.01); *F21S 43/16* (2018.01); *F21V 5/00* (2013.01)

(58) Field of Classification Search
CPC .................................................. G02B 6/0021
See application file for complete search history.

(56) References Cited

U.S. PATENT DOCUMENTS 8,582,051 B2 * 11/2013 Lee .................. G02B 6/0088
349/59
8,646,932 B2 2/2014 Lee et al.
(Continued)

FOREIGN PATENT DOCUMENTS

CN 102778778 A 11/2012
CN 107110433 A 8/2017
(Continued)

OTHER PUBLICATIONS

International Search Report dated Oct. 30, 2020 issued in Application No. PCT / KR2020 / 009740.
(Continued)

*Primary Examiner* — Eric T Eide
(74) *Attorney, Agent, or Firm* — KED & ASSOCIATES, LLP

(57) ABSTRACT

An embodiment may comprise a lighting device comprising: a substrate comprising a first side surface to a fourth side surface; a resin layer including a plurality of grooves including a bottom surface, an exit surface, and an inclined surface; a plurality of light emitting devices disposed inside the grooves and emitting a first light; a reflective layer formed on the inclined surface; and a diffusion layer disposed on the resin layer. The plurality of grooves extends in a direction from the third side surface to the fourth side surface and are arranged in a direction from the first side surface to a second side surface. The plurality of grooves includes a first groove closest to the first side surface of the substrate and a second groove adjacent to the first groove. The first light emitted from the light emitting device disposed in the second groove is reflected off the reflective layer formed on the inclined surface of the second groove, passes through the exit surface of the second groove, is reflected off the reflective layer formed on the inclined
(Continued)

surface of the first groove and passes through the resin layer and the diffusion layer.

20 Claims, 18 Drawing Sheets

(51) Int. Cl.
*F21S 43/16* (2018.01)
*F21S 43/15* (2018.01)
*F21V 5/00* (2018.01)

(56) References Cited

U.S. PATENT DOCUMENTS

| | | | | |
|---|---|---|---|---|
| 8,915,639 | B2* | 12/2014 | Kim | G02B 6/0028 362/616 |
| 9,279,931 | B2* | 3/2016 | Yokoyama | G02B 6/0078 |
| 10,527,250 | B2 | 1/2020 | Cho et al. | |
| 10,648,626 | B2 | 5/2020 | Hwang | |
| 2007/0274096 | A1* | 11/2007 | Chew | G02B 19/0066 362/345 |
| 2008/0210154 | A1* | 9/2008 | Nakano | G01D 11/28 362/23.17 |
| 2008/0310158 | A1 | 12/2008 | Harbers et al. | |
| 2009/0257215 | A1 | 10/2009 | Gomi | |
| 2009/0284956 | A1* | 11/2009 | Gomi | G02B 6/0018 362/97.3 |
| 2010/0026931 | A1 | 2/2010 | Yokoyama | |
| 2010/0073925 | A1 | 3/2010 | Vissenberg et al. | |
| 2010/0232138 | A1* | 9/2010 | Tsai | G02B 6/0068 362/97.1 |
| 2013/0003353 | A1 | 1/2013 | Kim | |
| 2013/0016521 | A1* | 1/2013 | Jung | G02B 6/0078 362/602 |
| 2015/0034987 | A1 | 2/2015 | Hayashi et al. | |
| 2015/0323833 | A1 | 11/2015 | Xie | |
| 2015/0362653 | A1* | 12/2015 | Chang | G02B 6/0021 362/606 |
| 2017/0097456 | A1 | 4/2017 | Yoon et al. | |

FOREIGN PATENT DOCUMENTS

| | | |
|---|---|---|
| KR | 10-1001599 | 12/2010 |
| KR | 10-2011-0000859 | 1/2011 |
| KR | 10-2011-0136651 | 12/2011 |
| KR | 10-2012-0014418 | 2/2012 |
| KR | 10-2012-0016972 A | 2/2012 |
| KR | 10-1196909 | 11/2012 |
| KR | 10-2014-0078377 A | 6/2014 |
| KR | 10-2015-0007704 | 1/2015 |
| KR | 10-1734545 | 5/2017 |
| KR | 10-2017-0125657 | 11/2017 |
| WO | WO 2008/032275 A1 | 3/2008 |
| WO | WO 2017-188670 A1 | 11/2017 |

OTHER PUBLICATIONS

Extended European Search Report dated Jun. 2, 2023 issued in Application 20847715.8.
Chinese Office Action dated Jun. 2, 2023 issued in Application 202080055376.6.

* cited by examiner

LIGHTING DEVICE

CROSS-REFERENCE TO RELATED PATENT APPLICATIONS

This application is a U.S. National Stage Application under 35 U.S.C. § 371 of PCT Application No. PCT/KR2020/009740, filed Jul. 23, 2020, which claims priority to Korean Patent Application No. 10-2019-0094040, filed Aug. 1, 2019, whose entire disclosures are hereby incorporated by reference.

TECHNICAL FIELD

An embodiment of the invention relates to a lighting device capable of providing a uniform surface light source and enhancing the exterior image.

BACKGROUND ART

Typical lighting applications include vehicle lights as well as backlights for displays and signage.

A light emitting device, for example, a light emitting diode (LED), has advantages such as low power consumption, semi-permanent lifespan, fast response speed, safety, and environmental friendliness compared to conventional light sources such as fluorescent lamps and incandescent lamps. Such light emitting diodes are being applied to various lighting devices such as various display devices, indoor lights or outdoor lights.

Recently, a lamp employing a light emitting diode has been proposed as vehicle lighting, and compared with an incandescent lamp, the light emitting diode is advantageous in that it consumes less power. Vehicle lighting may include a resin layer and a diffusion layer on a light emitting diode to emit a surface light source, and a phosphor layer may be disposed on the light emitting diode to emit light having a wavelength of a phosphor included in the phosphor layer to the outside. However, in the conventional vehicle lighting, a hot spot phenomenon of the light emitting diode occurs when turned on, and when not turned on, the color of the phosphor layer is exposed to the outside, thereby affecting the exterior image. Accordingly, when an ink layer is disposed on the light emitting diode or the bead content of the diffusion layer is increased in order to improve the exterior image of vehicle lighting, there is a problem in that the light extraction efficiency of the light emitting diode is lowered.

DISCLOSURE

Technical Problem

An embodiment may provide a lighting device including a new structure in which a hot spot phenomenon of a light emitting device is prevented and a phosphor layer is not exposed to the outside.

An embodiment may provide a lighting device that emits a uniform surface light source without degrading light extraction efficiency.

Technical Solution

A lighting device of an embodiment comprises a substrate including a first side surface and a second side surface opposite to the first side surface, a third side surface connecting the first side surface and the second side surface, and a fourth side surface opposite the third side surface; a resin layer including a plurality of grooves including a bottom surface to which the upper surface of the substrate is exposed, an exit surface extending from the bottom surface, and an inclined surface inclined at a predetermined angle from the exit surface; a plurality of light emitting devices disposed on the substrate inside the groove and emitting a first light; a reflective layer formed on the inclined surface; and a diffusion layer disposed on the resin layer, wherein the plurality of grooves are formed to extend toward the fourth side surface from the third side surface of the substrate and are arranged toward the second side surface from the first side surface of the substrate, wherein the plurality of grooves includes a first groove closest to a first side surface of the substrate and a second groove adjacent to the first groove, and the first light emitted from the light emitting device disposed in the second groove is reflected by the reflective layer formed on the inclined surface of the second groove, passes through the exit surface of the second groove, is reflected by the reflective layer formed on the inclined surface of the first groove, and may pass through the resin layer and the diffusion layer.

The lighting device according to the embodiment may include a phosphor layer disposed on the light emitting device.

The lighting device according to the embodiment may include a phosphor layer formed on a lower surface of the reflective layer.

The lighting device according to the embodiment may include a phosphor layer formed on an upper surface of the reflective layer.

In the lighting device according to the embodiment, the phosphor layer may be formed on the exit surface of the first groove.

In the lighting device according to the embodiment, the exit surface may have a convex shape in a direction from the second side surface to the first side surface of the substrate.

The lighting device according to the embodiment may include a reflective member extending in a direction parallel to the upper surface of the substrate from the reflective layer disposed in a region where the exit surface and the inclined surface are connected.

In the lighting device according to the embodiment, the first light emitted from the light emitting device disposed in the second groove is converted into second light having a wavelength different from that of the first light by the phosphor layer to pass through the diffusion layer.

Advantageous Effects

The embodiment may provide a lighting device capable of improving an external image because the phosphor layer is not exposed to the outside during non-lighting.

The embodiment may provide a lighting device emitting a uniform surface light source by preventing a hot spot phenomenon of the light emitting device.

BEST MODE

Figure 1:
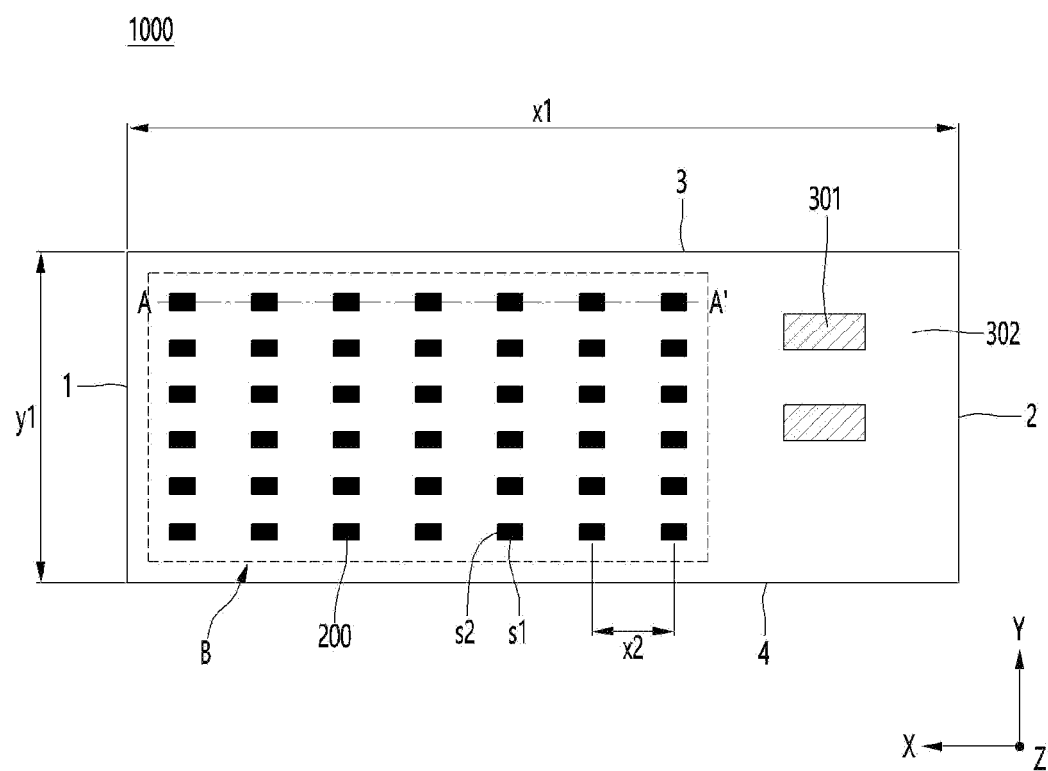
FIG. 1 is a plan view of a lighting device according to a first embodiment.

Hereinafter, preferred embodiments of the invention will be described in detail with reference to the accompanying drawings.

However, a technical spirit of the invention is not limited to some embodiments to be described, and may be implemented in various other forms, and one or more of the components may be selectively combined and substituted for use within the scope of the technical spirit of the invention. In addition, the terms (including technical and scientific terms) used in the embodiments of the invention, unless specifically defined and described explicitly, may be interpreted in a meaning that may be generally understood by those having ordinary skill in the art to which the invention pertains, and terms that are commonly used such as terms defined in a dictionary should be able to interpret their meanings in consideration of the contextual meaning of the relevant technology. Further, the terms used in the embodiments of the invention are for explaining the embodiments and are not intended to limit the invention.

In this specification, the singular forms also may include plural forms unless otherwise specifically stated in a phrase, and in the case in which at least one (or one or more) of A and (and) B, C is stated, it may include one or more of all combinations that may be combined with A, B, and C. In describing the components of the embodiments of the invention, terms such as first, second, A, B, (a), and (b) may be used. Such terms are only for distinguishing the component from other component, and may not be determined by the term by the nature, sequence or procedure etc. of the corresponding constituent element. And when it is described that a component is "connected", "coupled" or "joined" to another component, the description may include not only being directly connected, coupled or joined to the other component but also being "connected", "coupled" or "joined" by another component between the component and the other component.

In addition, in the case of being described as being formed or disposed "above (on)" or "below (under)" of each component, the description includes not only when two components are in direct contact with each other, but also when one or more other components are formed or disposed between the two components. In addition, when expressed as "above (on)" or "below (under)", it may refer to a downward direction as well as an upward direction with respect to one element.

The lighting device according to the invention may be applied to various lamp devices that require lighting, for example, a vehicle lamp, a home lighting device, or an industrial lighting device. For example, when applied to vehicle lamps, it may be applied to head lamps, sidelights, side mirror lamps, fog lamps, tail lamps, brake lamps, daytime running lamps, vehicle interior lighting, door scarves, rear combination lamps, backup lamps, etc. The lighting device of the invention may be applied to indoor and outdoor advertising devices, display devices, and various fields of electric vehicles, and may be applied to all lighting related fields or advertisement related fields which have been developed and commercialized or may be implemented in accordance with future technology development.

Figure 2:
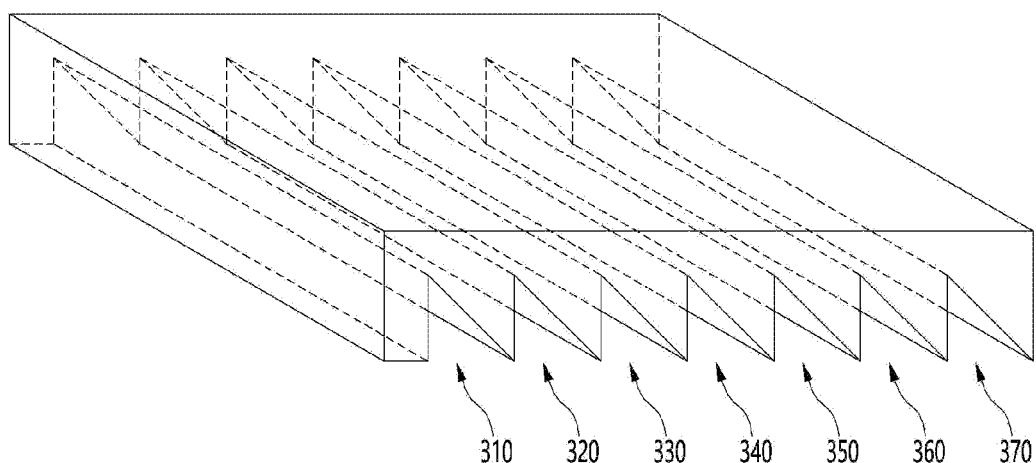
FIG. 2 is a side view illustrating a resin layer in region B according to the first embodiment.
Figure 3:
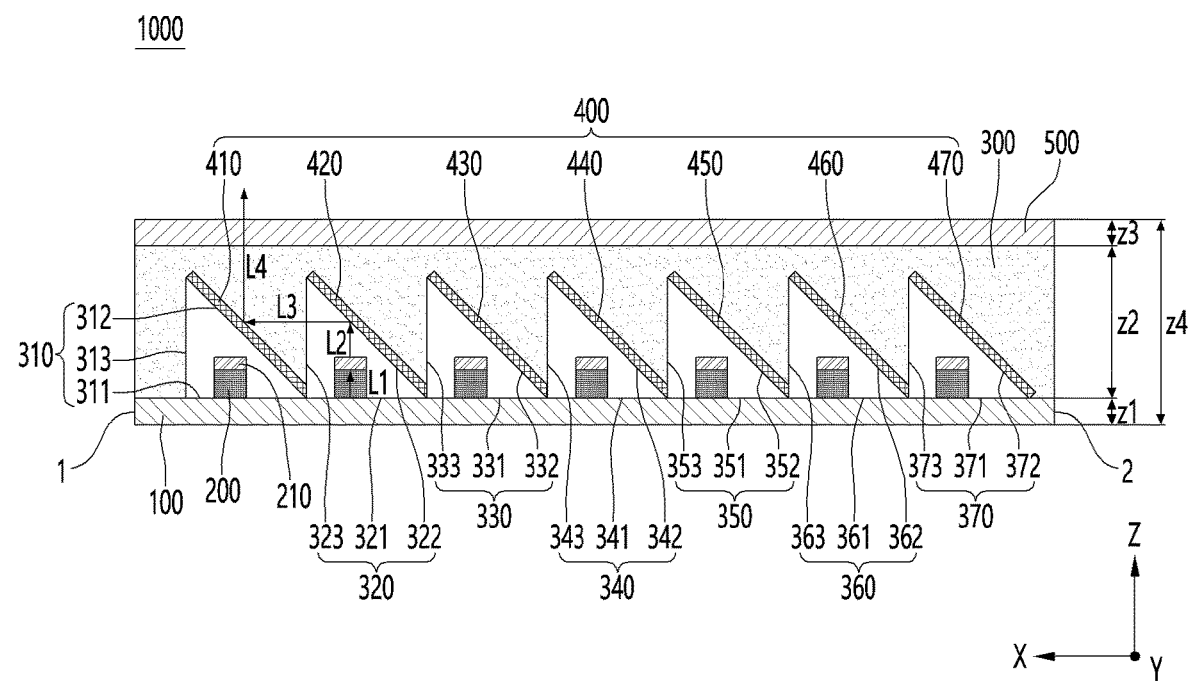
FIG. 3 is a cross-sectional view taken along line A-A' of the lighting device according to the first embodiment.

FIG. 1 is a plan view of a lighting device 1000 according to a first embodiment, FIG. 2 is a side view showing a resin layer in region B according to the first embodiment, and FIG. 3 is a cross-sectional view of A-A' of a lighting device 1000 according to the first embodiment. As shown in FIGS. 1 to 3, the lighting device 1000 according to the first embodiment is disposed on a circuit board 100, a resin layer (300) disposed on the circuit board 100 and including a plurality of grooves 310, 320, 330, 340, 350, 360, and 370 having bottom surfaces 311, 321, 331, 341, 351, 361, and 371, inclined surfaces 312, 322, 332, 342, 352, 362, and 372, exit surfaces 313, 323, 333, 343, 353, 363, and 373, a diffusion layer 500 disposed on the resin layer 300, a plurality of light emitting devices 200 disposed within a plurality of grooves 310, 320, 330, 340, 350, 360 and 370 of the resin layer 300, a phosphor layer 210 disposed on the light emitting device 200, and a reflective layers 410, 420, 430, 440, 450, 460, and 470 formed to the inclined surfaces 312, 322, 323 343, 353, 363, and 373.

As shown in FIGS. 1 to 3, the lighting device 1000 may emit the light emitted from the light emitting device 200 as a surface light source. A plurality of the light emitting devices 200 may be disposed on the circuit board 100. In the lighting device 1000, the plurality of light emitting devices 200 may be arranged in N columns (N is an integer greater than or equal to 1) and/or M rows (M is an integer greater than or equal to 1). The plurality of light emitting devices 200 may be arranged in N columns and M rows (N and M are integers greater than or equal to 2) as shown in FIG. 1.

The lighting device 1000 according to the first embodiment can be applied to various lamp devices required for lighting, for example, a vehicle lamp, a home lighting device, and an industrial lighting device. For example, in the case of a lighting module applied to a vehicle lamp, a head lamp, a side lamp, a side mirror lamp, a fog lamp, a tail lamp, a turn signal lamp, a stop lamp, daytime running right, vehicle interior lighting, door scarf, rear combination lamp, backup lamp, etc.

Referring to FIGS. 1 and 3, the circuit board 100 may function as a base member or a support member positioned under the plurality of light emitting devices 200, the resin layer 300, and the diffusion layer 500. The circuit board 100 may include a printed circuit board (PCB). For example, the circuit board 100 may include at least one of a resin-based printed circuit board (PCB), a metal core PCB, a flexible PCB, a ceramic PCB, or an FR-4 board.

The upper surface of the circuit board 100 may have an X-axis and Y-axis plane, and the thickness of the circuit board 100 may be a height in the Z direction orthogonal to the X direction and the Y direction. Here, the X direction may be a first direction, the Y direction may be a second direction orthogonal to the X direction, and the Z direction may be a third direction orthogonal to the X direction and the Y direction.

The circuit board 100 may include a wiring layer (not shown) thereon, and the wiring layer may be electrically connected to the light emitting device 200. A reflective layer or a protective layer may be disposed on the circuit board 100, and the reflective layer or the protective layer may protect the wiring layer. The plurality of light emitting devices 200 may be connected in series, parallel, or series-parallel by a wiring layer of the circuit board 100. In the plurality of light emitting devices 200, groups having two or more may be connected in series or in parallel, or between the groups may be connected in series or in parallel.

The first direction (X direction) length x1 and the second direction (Y direction) length y1 of the circuit board 100 may be different from each other, for example, the length x1 in the first direction X may be disposed to be longer than the length y1 in the second direction Y. The length x1 in the first direction X may be at least twice as long as the length y1 in the second direction Y. The thickness z1 of the circuit board 100 may be 1.0 mm or less, for example, in the range of 0.5 mm to 1.0 mm. Since the thickness z1 of the circuit board 100 is provided thin, the thickness of the lighting module may not be increased. Since the circuit board 100 has a thickness z1 of 1.0 mm or less, it may support a flexible module. The distance from the lower surface of the circuit board 100 to the upper surface of the diffusion layer 500 may be the thickness of the lighting device 1000.

The thickness z4 of the lighting device 1000 may be ⅓ or less of the shorter length among the lengths x1 and y1 in the first direction (X direction) and the second direction (Y direction) of the circuit board 100, but is not limited thereto. The thickness z4 of the lighting device 1000 may be 5.5 mm or less, 4.5 mm to 5.5 mm, or 4.5 mm to 5 mm from the bottom of the circuit board 100. The thickness z4 of the lighting device 1000 may be a linear distance between the lower surface of the circuit board 100 and the upper surface of the diffusion layer 500. The thickness z4 of the lighting device 1000 may be 220% or less of the thickness z2 of the resin layer 300, for example, in the range of 180% to 220%. Since the thickness z4 of the lighting device 1000 is 5.5 mm or less, it may be provided as a flexible and slim surface light source module.

When the thickness z4 of the lighting device 1000 is thinner than the above range, the light diffusion space is reduced and a hot spot may be generated. The embodiment provides a lighting device capable of a curved structure by providing a thickness z4 of the lighting device 1000 of 5.5 mm or less or 5 mm or less, thereby reducing design freedom and spatial restrictions. The ratio of the length y1 of the second direction Y of the lighting device 1000 to the thickness z4 of the lighting device 1000 may be 1:m, and may have a ratio relationship of m≥1, the m is a natural number equal to or greater than 1, and the column of the light emitting device 200 may be an integer smaller than the m. For example, when the m is greater than four times the thickness z4 of the lighting device 1000, the light emitting devices 200 may be arranged in four rows.

A part of the circuit board 100 may include a connector 301 to supply power to the light emitting devices 200. In the circuit board 100, the region 302 in which the connector 301 is disposed is a region in which the resin layer 300 is not formed, and may be less than or equal to a length y1 in the second direction Y of the circuit board 100. The connector 301 may be disposed on a part of an upper surface or a part of a lower surface of the circuit board 100. When the connector 301 is disposed on the bottom surface of the circuit board 100, the region may be removed. The circuit board 100 may have a top view shape of a rectangle, a square, or other polygonal shapes, and may have a bar shape having a curved shape. The connector 301 may be a terminal connected to the light emitting device 200 or a female connector or a male connector.

The protective layer or the reflective layer may include a member having a solder resist material, and the solder resist material is a white material and may reflect incident light.

As another example, the circuit board 100 may include a transparent material. Since the circuit board 100 made of the transparent material is provided, the light emitted from the light emitting device 200 may be emitted in an upper surface direction and a lower surface direction of the circuit board 100.

The light emitting device 200 may be disposed on the circuit board 100. The light emitting device 200 has an upper surface S1 and a plurality of side surfaces S2, the upper surface S1 faces the lower surface of the diffusion layer 500 and emits light in a direction of the diffusion layer 500 from the light emitting device 200. Most of the light may be emitted through the upper surface S1 of the light emitting device 200. In addition, the plurality of side surfaces S2 of the light emitting device 200 includes at least four side surfaces, and light is emitted in a lateral direction of the light emitting device 200 through the side surfaces. The light emitting device 200 is an LED chip that emits light on at least five sides, and may be disposed on the circuit board 100 in the form of a flip chip. The light emitting device 200 may be formed to a thickness of 0.3 mm or less.

In the light emitting device 200 according to the embodiment, the directional angle may be increased by five-sided light emission. The light emitting device 200 may be disposed on the circuit board 100 as a flip chip. The interval x2 in the first direction X between the light emitting devices 200 may be equal to or greater than the thickness z2 (x2≤z2) of the resin layer 300. The distance x2 between the light emitting devices 200 may be, for example, 2.5 mm or more, and may vary depending on the size of the LED chip.

The light emitting device 200 is a light emitting diode (LED) chip, and may emit at least one of blue, red, green, ultraviolet (UV), and infrared rays. The light emitting device 200 may emit, for example, at least one of blue, red, and green. The light emitting device 200 may be electrically connected to the circuit board 100, but is not limited thereto.

A phosphor layer 210 may be disposed on the light emitting device 200. The phosphor layer 210 may cover an upper surface of the light emitting device 200. The phosphor layer 210 may include a transparent material. The phosphor layer 210 may include a transparent insulating material. The phosphor layer 210 may be made of a silicon material, or may be made of a silicon material having different chemical bonds. Silicone is a polymer in which inorganic silicon and organic carbon are combined, and has physical properties such as thermal stability, chemical stability, abrasion resistance, and glossiness of inorganic substances and reactivity, solubility, elasticity, and processability, which are characteristics of organic substances. The silicon may include general silicon and fluorine silicon with an increased fluorine ratio. Increasing the fluorine ratio of the fluorinated silicon has the effect of improving moisture resistance.

The phosphor layer 210 may include a wavelength conversion mean that receives the light emitted from the light emitting device 200 and provides wavelength-converted light. For example, the phosphor layer 210 may include at least one selected from the group consisting of phosphors and quantum dots. The phosphor or quantum dots may emit blue, green, or red light. The phosphor may be uniformly disposed in the phosphor layer 210. The phosphor may include a phosphor of a fluoride compound, for example, may include at least one of an MGF-based phosphor, a KSF-based phosphor, or a KTF-based phosphor.

Referring to FIGS. 2 and 3, the resin layer 300 may be disposed on the circuit board 100 and the light emitting device 200. The resin layer 300 may diffuse the light emitted from the light emitting device 200.

The resin layer 300 includes a plurality of grooves 310, 320, 330, 340, 350, 360 and 370 each having a bottom surface 311, 321, 333, 341, 351, 361 and 371, an inclined surface 312, 322, 332, 342, 352, 362, and 372, and an exit surface 313, 323, 333, 343, 353, 363 and 373.

The plurality of grooves 310, 320, 330, 340, 350, 360 and 370 may be arranged to predetermined interval in a first direction X, which is a direction from the first side surface 1 to the second side surface 2 of the circuit board 100. The plurality of grooves 310, 320, 330, 340, 350, 360 and 370 may be extended from the third side surface 3 to the fourth side surface 4 of the circuit board 100 in the second direction Y.

The first groove 310 disposed closest to the first side surface 1 of the circuit board 100 may include a first bottom surface 311 through which the upper surface of the circuit board 100 is exposed, a first exit surface 313 extending from the first bottom surface 311, and a first inclined surface 312 extending at a predetermined angle from the first exit surface 313.

The first bottom surface 311 may expose a part of the upper surface of the circuit board 100, and the plurality of the light emitting device 200 may be disposed on a part of the upper surface of the circuit board 100 exposed by the first bottom surface 311. The first exit surface 313 may extend from the first bottom surface 311. The first exit surface 313 may be formed to extend in a vertical direction from the first bottom surface 311. The first inclined surface 312 may be inclined at a predetermined angle from the first exit surface 313. The first inclined surface 312 may be inclined at a predetermined angle from the first bottom surface 311. A first reflective layer 410 may be disposed on the first inclined surface 312. The remaining grooves except for the first groove 310 among the plurality of grooves 310, 320, 330, 340, 350, 360 and 370 may be formed in the same shape as the first groove 310.

A process in which light emitted from the light emitting device 200 disposed in the plurality of grooves 310, 320, 330, 340, 350, 360 and 370 proceeds to the upper portion of the resin layer 300 will be described with reference to FIG. 3.

For example, the first light L1 emitted from the light emitting device 200 disposed in the first groove 310 closest to the first side surface 1 of the circuit board 100 travels to the upper portion of the light emitting device 200 through the phosphor layer 210 disposed on the upper surface of the light emitting device 200, and may be converted into the second light L2 having a wavelength different from that of the first light L1 by the phosphor layer 210. The second light L2 may travel upwards of the light emitting device 200 and be reflected in the direction of the first exit surface 313 by the first reflective layer 410 disposed on the first inclined surface 312. The third light L3 that has passed through the first exit surface 313 is diffused by the resin layer 300 disposed on the side surface of the first groove 310, may progress toward the side surface of the resin layer 300 disposed on an upper portion of the resin layer 300 and the first side surface S1 of the circuit board 100 and be emitted to the outside of the lighting device 1000. In this case, since the third light L3 is reflected only by the first reflective layer 410 disposed on the first inclined surface 312, the wavelength of the third light L3 may be the same as that of the second light L2.

In addition, the first light L1 emitted from the light emitting device 200 disposed in the plurality of grooves $3n0$ ($n≥2$, n is an integer) except for the first groove 310 passes through the phosphor layer 210 disposed on the upper surface of the light emitting device 200 and then proceeds the upper portion of the light emitting device 200, and may be converted into light L2 having a wavelength different from that of the first light L1 by the phosphor layer 210. The second light L2 travels over the light emitting device 200, is reflected by the n-th reflective layer $4n0$ in the direction of the n-th exit surface $3n3$, and passes through the n-th exit surface $3n3$. The light L3 passing through the n-th exit surface $3n3$ is reflected to the upper portion of the resin layer 300 by the $(n-1)$th reflective layer $4(n-1)0$ disposed adjacent to the nth exit surface $3n3$, and then a fourth light L4 may be emitted to the outside. At this time, since the fourth light L4 and the third light L3 are only reflected by the n-th reflective layer $4n0$ or the $(n-1)$th reflective layer $4(n-1)0$, they may have the same wavelength as the second light L2.

As described above, the light emitting device 200 is disposed in the plurality of grooves 310, 320, 330, 340, 350, 360 and 370 of the resin layer 300, and the light emitted from the light emitting device 200 does not proceed directly to the upper portion of the resin layer 300, and is reflected by the reflective layer 400 disposed on the inclined surfaces 312, 322, 332, 342, 352, 362 and 372 of the plurality of grooves 310, 320, 330, 340, 350, 360 and 370, and then proceeds to the upper portion of the resin layer 300, so that the lighting device 1000 according to the first embodiment may emit a uniform surface light source.

In addition, since the reflective layer 400 is formed on the inclined surfaces 312, 322, 332, 342, 352, 362, and 372 of the plurality of grooves 310, 320, 330, 340, 350, 360, and 370 and overlaps with the light emitting device 200 in the vertical direction, the light emitting device 200 is not visually recognized from the outside by the reflective layer 400, so that a hot spot of the light emitting device 200 is prevented when the lighting device is turned on, when the lighting device is not turned on, the phosphor layer 210 disposed on the light emitting device 200 is not visually recognized to the outside, so that the external image of the lighting device 1000 may be improved.

The resin layer 40 may be made of a transparent resin material, for example, a resin material such as UV (ultra violet) resin, silicone, or epoxy. The resin layer 40 may be a diffusion layer without a diffusion agent or a molding layer. The UV resin may be, for example, a resin (oligomer type) containing a urethane acrylate oligomer as a main material. For example, it is possible to use a synthetic oligomer urethane acrylate oligomer. The main material may further include a monomer in which isobornyl acrylate (IBOA), hydroxybutyl acrylate (HBA), and hydroxy metaethyl acrylate (HEMA), which are low boiling point diluent type reactive monomers, are mixed, and as an additive, a photoinitiator (for example, 1-hydroxycyclohexyl phenyl-ketone, Diphenyl), Diphenyl (2,4,6-trimethylbenzoyl phosphine oxide), an antioxidant or the like may be mixed. The UV resin may be formed of a composition including 10 to 21% of an oligomer, 30 to 63% of a monomer, and 1.5 to 6% of an additive. The formation of the resin layer using the above-described composition may form a layer with a resin such as UV resin instead of a light guide plate to adjust the refractive index and the thickness, and simultaneously, may satisfy all of adhesive characteristics, reliability and a mass production rate by using the above-described composition.

The reflective layer 400 may be formed in the form of a film such as a silver (Ag) film, and may also be formed of a synthetic resin dispersedly containing a white pigment in order to promote reflection and dispersion of light. For example, the white pigment may include any one of titanium oxide, aluminum oxide, zinc oxide, carbonate, barium sulfate, and calcium carbonate. For example, a synthetic resin may any one of polyethylene terephthalate (PET), polyethylene naphthalate (PEN), acrylic (Acrylic), polycarbonate (Polycarbonate), polystyrene (Polystyrene), polyolefin (Polyolefin), cellulose acetate and vinyl chloride.

The diffusion layer 500 may be disposed on the resin layer 300. The diffusion layer 500 may be attached on the resin layer 300 by applying a predetermined pressure or pressure/heat. Since the diffusion layer 500 is adhered to the resin layer 300 by the self-adhesive force of the resin layer 300 without a separate adhesive, the lighting device 1000 according to the embodiment performs the process of separately attaching the adhesive during the manufacturing process and is possible to reduce the use of adhesives that are harmful to the human body, thereby reducing process or material waste.

The diffusion layer 500 may be adhered to the upper surface of the resin layer 300. Since a specific color may not be mixed when the luminous intensity of light is high, the diffusion layer 500 may diffuse and mix the lights. The material of the diffusion layer 500 may be a light-transmitting material. For example, the diffusion layer 500 may include at least one of a polyester (PET) film, a poly methyl methacrylate (PMMA) material, or a polycarbonate (PC) material. The diffusion layer 500 may be provided as a film made of a resin material such as silicone or epoxy. The diffusion layer 500 may include a single layer or multiple layers.

The thickness z3 of the diffusion layer 500 is 25 micrometers or more, and for example, may be in the range of 25 to 250 micrometers or in the range of 100 to 250 micrometers. The diffusion layer 500 has the thickness z3 in the range and may provide incident light as a uniform surface light source.

As described above, in the lighting device 1000 according to the first embodiment, the light emitted from the light emitting device 200 is not directly emitted to the outside, but is reflected by the reflective layer 400 and emitted to the outside, so that a uniformly surface light source may be emitted.

Figure 4:
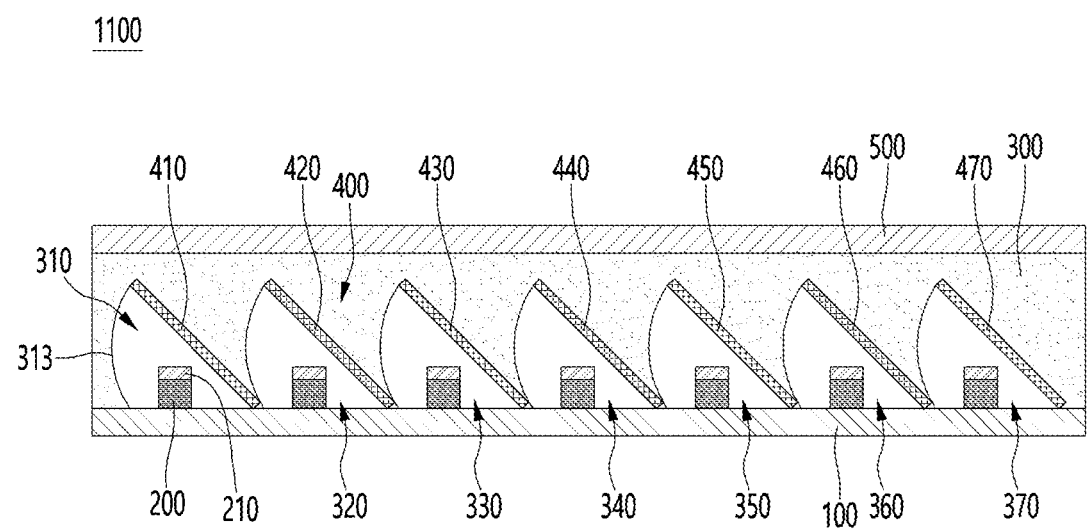
FIG. 4 is a cross-sectional view taken along line A-A' of a lighting device according to a modified example of the first embodiment.

FIG. 4 is a cross-sectional view taken along line A-A' of the lighting device 1100 according to a modification of the first embodiment. In FIG. 4, the content previously described in the lighting device 1000 according to the first embodiment shown in FIGS. 1 to 3 may be adopted.

Referring to FIG. 4, in the lighting device 1100 according to a modified example of the first embodiment, the first exit surface 313 of the first groove 310 may be formed to be concave toward the first side surface 1 direction from the second side surface 2 of the circuit board 100. The first exit surface 313 may be formed in a concave lens shape, but is not limited thereto.

Light emitted from the light emitting device 200 disposed in the first groove 310 is reflected by the first reflective layer 410 disposed on the light emitting device 200 to proceed to the first exit surface 313. In this case, since the first exit surface 313 has a concave lens shape, the efficiency of light passing through the first exit surface 313 may be increased.

In addition, the second exit surface 323 to the seventh exit surface 373 may be formed in the same shape as the first exit surface 313. Accordingly, the light emitted from the light emitting device 200 disposed in the second groove 320 to the seventh groove 370 to be emitted to the outside may be proceed in the same manner as the light emitted from the light emitting device 200 disposed in the second groove 320 to the second groove 320 according to the basic example of the first embodiment proceeds.

Therefore, in the lighting device 1100 according to the modified example of the first embodiment, the exit surfaces 313, 323, 333, 343, 353, 363, and 373 are formed in a concave lens shape to provide a lighting device with improved light extraction efficiency.

Figure 5:
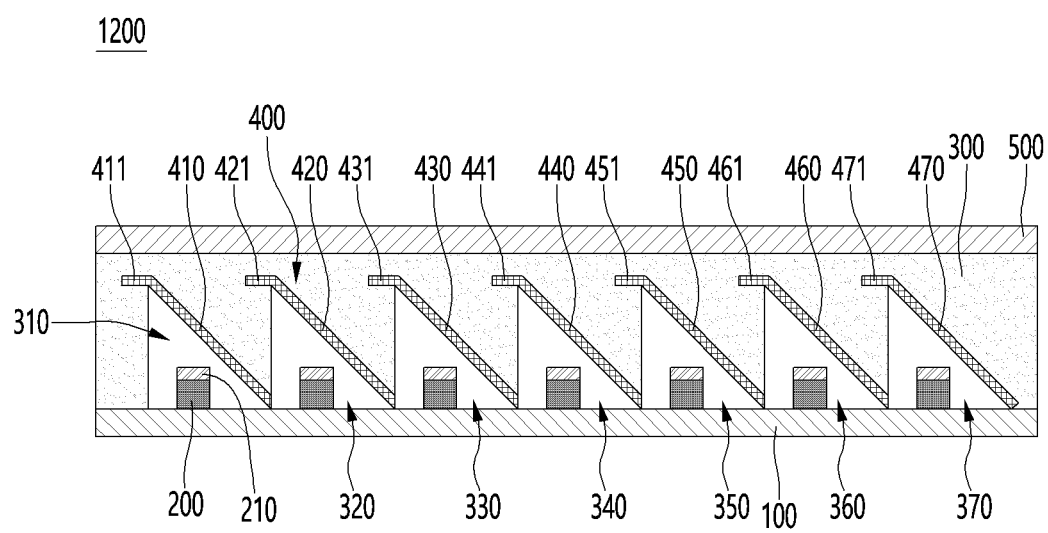
FIG. 5 is a cross-sectional view taken along line A-A' of a lighting device according to a modification of the first embodiment.

FIG. 5 is a cross-sectional view taken along line A-A' of the lighting device 1200 according to a modified example of the first embodiment. In FIG. 5, the contents previously described in the lighting devices 1000 and 1100 according to the first embodiment shown in FIGS. 1 to 4 may be adopted.

Referring to FIG. 5, in a modified example of the first embodiment, the lighting device 1200 may include a first reflective member 411 extending from the first reflective layer 410 and extending in a direction parallel to the upper surface of the circuit board 100.

The first reflective member 411 may be formed to extend from an end of the first reflective layer 410. The first reflective member 411 may be formed to protrude from an end of the first reflective layer 410 in a direction perpendicular to the first exit surface 313. The first exit surface 313 and the first reflective member 411 may not overlap in a vertical direction. The first reflective member 411 may be formed to extend in parallel direction to the upper surface of the circuit board 100 from the first reflective layer 410 disposed in a region where the first exit surface 313 and the first inclined surface 312 are connected. The first reflective member 411 may be integrally formed with the first reflective layer 410, but is not limited thereto. The first reflective member 411 may be formed of the same material as the first reflective layer 410, but is not limited thereto.

Light emitted from the light emitting device 200 disposed in the first groove 310 is reflected by the first reflective layer 410 and proceeds to the upper portions of the resin layer 300 and the diffusion layer 500 or may directly proceed the upper portion of the resin layer 300 and the diffusion layer 500 without being reflected by the reflective layer 410. Since the intensity of light reflected by the first reflective layer 410 and the intensity of light directly transmitted from the light emitting device 200 without being reflected are different from each other, this causes deterioration of light uniformity. Accordingly, the first reflective member 411 may reflect the light directly transmitted from the light emitting device 200 or prevent the light directly from proceeding. At this time, the first reflective member 411 extends from the end of the first reflective layer 410 to increase the light uniformity from the front outside the lighting device 1200, and prevents the light emitting device 200 recognized from the side surface of the lighting device, and thus the external image of the lighting device 1200 may be improved.

In addition, in the same manner that the first reflective member 411 is disposed at the end of the first reflective layer 410, a second reflective member 421 to the seventh reflective member 471 may be disposed at the ends of the second reflective layer 420 to the seventh reflective layer 470. Accordingly, the light emitted from the light emitting device 200 disposed in each of the second groove 320 to the seventh groove 370 may be emitted to the outside by proceeding in the same manner as in the process in which the light emitted from the light emitting device 200 disposed in each of the second groove 320 to the seventh groove 370 according to the basic example of the first embodiment proceeds.

Accordingly, in the lighting device 1200 according to a modification of the first embodiment, the lighting device 1200 prevents light from proceeding an upper portion of the resin layer 300 and the diffusion layer 500 on the adjacent region of the exit surfaces 313, 323, 333, 343, 353, 363, and 373 by the first reflective member 411 to the seventh reflective member 417, and proceeds a uniform surface light source, and prevents the lighting emitting device 200 from being recognized from the outside, thereby improving an external image.

Figure 6:
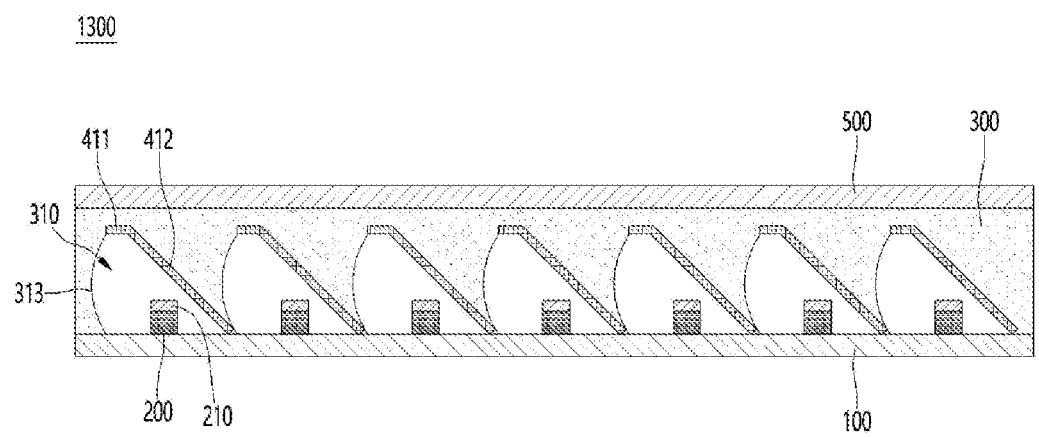
FIG. 6 is a cross-sectional view taken along line A-A' of a lighting device according to a modification of the first embodiment.

FIG. 6 is a cross-sectional view taken along line A-A' of the lighting device 1300 according to a modification of the first embodiment. In FIG. 6, the contents previously described in the lighting devices 1000, 1100, and 1200 according to the first embodiment shown in FIGS. 1 to 5 may be adopted.

In the lighting device 1300 according to the modified example of the first embodiment, the exit surfaces 313, 323, 333, 343, 353, 363, and 373 of the plurality of grooves 310, 320, 330, 340, 350, 360, 370 are formed concavely in the direction of the first side surface 1 from the second side surface 2 of the circuit board 100, and the lighting device 1300 may include reflective members 411, 421 431, 441, 451, 461, and 471 extending from the reflective layer 400 and extending in a direction parallel to the upper surface of the circuit board 100. At this time, the reflective members 411, 421, 431, 441, 451, 461, and 471 are different from the modified example of the first embodiment of FIG. 5, and may overlap the exit surfaces 313, 323, 333, 343, 353, 363, and 373 in the vertical direction.

Figure 7:
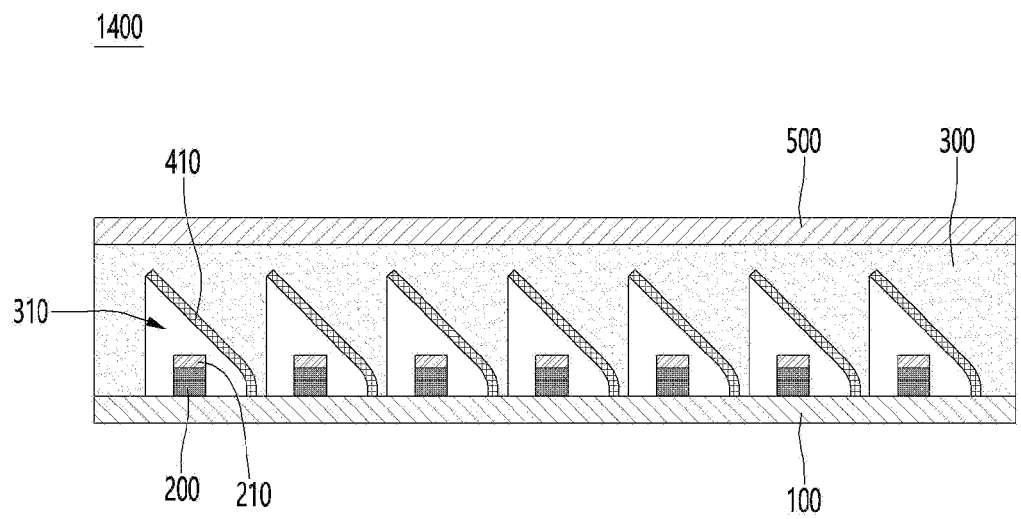
FIG. 7 is a cross-sectional view taken along line A-A' of a lighting device according to a modified example of the first embodiment.

FIG. 7 is a cross-sectional view taken along line A-A' of the lighting device 1400 according to a modified example of the first embodiment. In FIG. 7, the contents previously described in the lighting devices 1000, 1100, 1200, and 1300 according to the first embodiment shown in FIGS. 1 to 6 may be adopted.

As shown in FIG. 7, in the lighting device 1400 according to a modified example of the first embodiment, a portion of each of the inclined surfaces 312, 322, 332, 342, 352, 362, and 372 overlapping the light emitting device 200 disposed in each of the plurality of groove 310, 320, 330, 340, 350, 360, and 370 in the first direction X may be formed as curved surfaces. Accordingly, a portion of the reflective layer 400 formed in a region adjacent to the second exit surface 323 to the seventh exit surface 373 may be formed with a curved surface. Therefore, light emitted from the light emitting device 200 disposed in each of the plurality of grooves 310, 320, 330, 340, 350, 360, and 370 is not reflected upward by the curved reflective layer 400, and a hot spot phenomenon that may occur in a region adjacent to the second exit surface 323 to the seventh exit surface 373 may be prevented.

Figure 8:
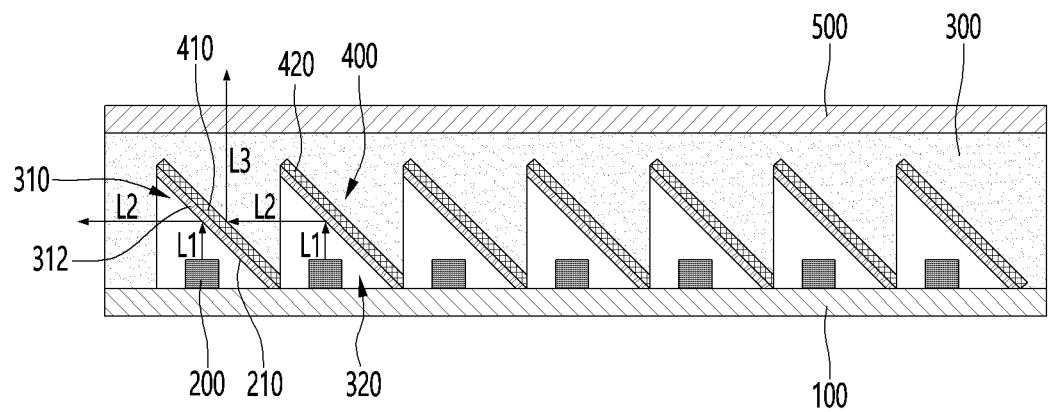
FIG. 8 is a cross-sectional view taken along line A-A' of the lighting device according to the second embodiment.

FIG. 8 is a cross-sectional view taken along line A-A' of the lighting device 2000 according to the second embodiment. In FIG. 8, the contents previously described in the lighting devices 1000, 1100, 1200, 1300, and 1400 according to the first embodiment shown in FIGS. 1 to 7 may be adopted.

Referring to FIG. 8, a lighting device 2000 according to the second embodiment may include a phosphor layer 210 disposed on the inclined surfaces 312, 322, 332, 342, 352, 362, and 372 and a reflective layer 400 disposed on a phosphor layer 210. The reflective layer 400 may contact the entire upper surface of the phosphor layer 210.

A process in which light emitted from the light emitting device 200 disposed in the plurality of grooves 310, 320, 330, 340, 350, 360, and 370 travels to the upper portion of the resin layer 300 will be described.

For example, the first light L1 emitted from the light emitting device 200 disposed in the first groove 310 is directed toward the upper portion of the light emitting device 200, and may be incident on the phosphor layer 210 formed on the first inclined surface 312. The first light L1 incident on the phosphor layer 210 is converted into the second light L2 having a wavelength different from that of the first light L1, and the second light L2 may be reflected in the direction of the first exit surface 313 while being converted by the first reflective layer 410 disposed on the phosphor layer 210. The second light L2 passing through the first exit surface 313 is diffused by the resin layer 300 disposed on the side surface of the first groove 310, proceeds to the upper portion and side surfaces of the resin layer 300, and may be emitted to the outside of the lighting device 2000.

In addition to, the first light L1 emitted from the light emitting device 200 disposed in the plurality of grooves 3*n*0 (n≥2, n is an integer) except for the first groove 310 may travel an upwards of the light emitting device 200 and may be incident to the phosphor layer 210 formed on the n-th inclined surface 3*n*2. The first light L1 incident on the phosphor layer 210 is converted into the second light L2 having a wavelength different from that of the first light L1, and the second light L2 may be reflected in the direction of the n-th exit surface 3*n*3 while being converted by the n-th reflective layer 420 disposed on the phosphor layer 210. The second light L2 passing through the n-th exit surface 3*n*3 may be re-reflected in the upper direction of the resin layer 300 and the diffusion layer 500 by the (n−1)th reflective layer 4(*n*−1)0 formed on the (n−1)th inclined surface 3(*n*−1)2 to emit a third light L3 to the outside of the lighting device 2000.

Accordingly, in the lighting device 2000 according to the second embodiment, the first light L1 emitted from the light emitting device 200 proceeds upward, and is converted into the second light L2 having a wavelength different from that of the first light L1 by the phosphor layer 210 formed on the inclined surfaces 312, 322, 333, 343, 353, 363, and 373 of the plurality of grooves 310, 320, 330, 340, 350, 360, and 370, and the second light L2 may proceed to a third light L3 reflected by the reflective layer 400 disposed on the phosphor layer 210, and the third light L3 is transmitted to the upper portions of the resin layer 300 and the diffusion layer 500 to provide a uniform light source surface. In this case, since the third light L3 is only reflected by the (n−1)th reflective layer 4(n−1)0, it may have the same wavelength as the second light L2.

In addition, since the reflective layer 400 is disposed on the inclined surfaces 312, 322, 333, 343, 353, 363, and 373 and vertically overlaps with the light emitting device 200, the reflective layer 400 prevents the light emitting device 200 from being visually recognized from the outside and prevents a hot spot of the light emitting device 200 from being generated when the lighting device is turned on, and when the lighting device is not turned on, the phosphor layer 210 disposed on the light emitting device 200 is not visually recognized to the outside, thereby improving the external image of the lighting device 1300.

Figure 9:
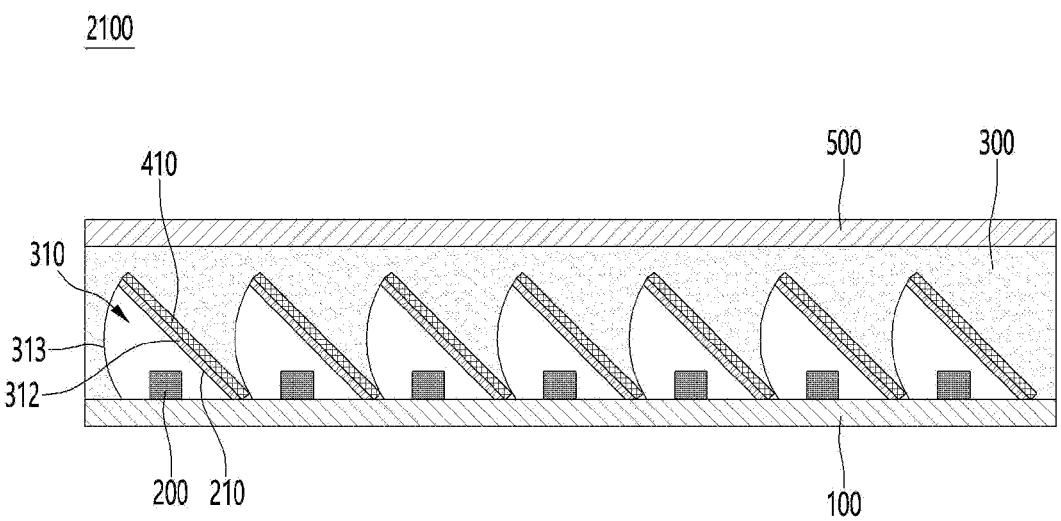
FIG. 9 is a cross-sectional view taken along line A-A' of a lighting device according to a modified example of the second embodiment.

FIG. 9 is a cross-sectional view taken along line A-A' of a lighting device 2100 according to a modified example of the second embodiment. In FIG. 9, the content previously described in the lighting apparatus 2000 according to the second embodiment shown in FIG. 8 may be adopted.

Referring to FIG. 9, in the lighting device 2100 according to a modified example of the second embodiment, the first exit surface 313 of the first groove 310 may be concave toward in the direction of the first side surface 1 of the circuit board 100. The first exit surface 313 may be formed in a concave lens shape, but is not limited thereto.

Light emitted from the light emitting device 200 disposed in the first groove 310 may be reflected by the first reflective layer 410 disposed on the light emitting device 200 to proceed to the first exit surface 313. In this case, since the first exit surface 313 has a concave lens shape, the efficiency of light passing through the first exit surface 313 may be increased.

In addition, the second exit surface 323 to the seventh exit surface 373 may be formed in the same shape as the first exit surface 313. Accordingly, the light emitted from the light emitting device 200 disposed in each of the second groove 320 to the seventh groove 370 is emitted to the outside by proceeding in the same manner as in the process in which the light emitted from the light emitting device 200 disposed in each of the second groove 320 to the seventh groove 370 according to the basic example of the second embodiment proceeds.

Therefore, in the lighting device 2100 according to the modified example of the second embodiment, the exit surfaces 313, 323, 333, 343, 353, 363, and 373 are formed in a concave lens shape to improve light extraction efficiency, and the phosphor layer 210 is disposed under the reflective layer 400 formed to each of the inclined surfaces 312, 322, 332, 342, 352, 362, and 372, so that the phosphor layer 210 is not visually recognized from the outside, thereby improving the external image of the lighting device 2100.

Figure 10:
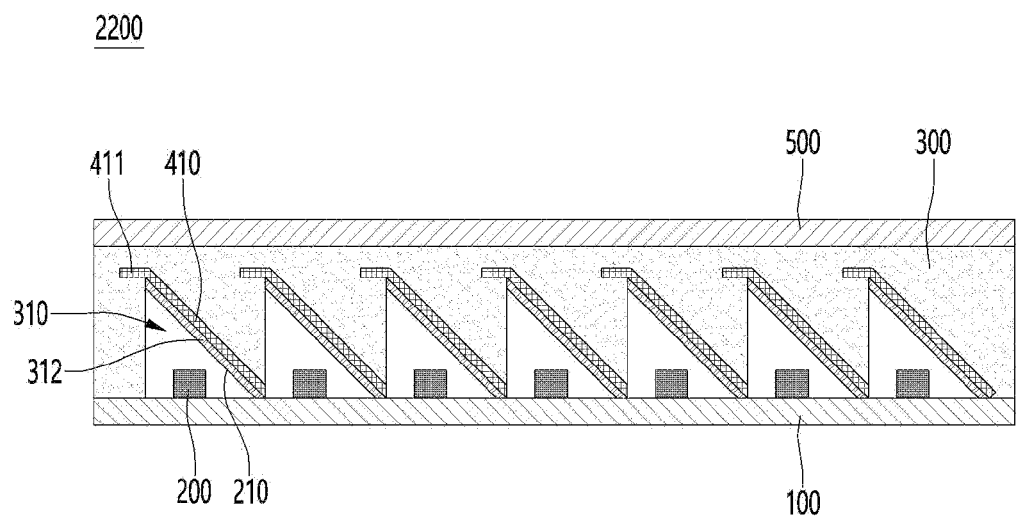
FIG. 10 is a cross-sectional view taken along line A-A' of a lighting device according to a modified example of the second embodiment.

FIG. 10 is a cross-sectional view taken along line A-A' of a lighting device 2200 according to a modified example of the second embodiment. In FIG. 10, the contents previously described in the lighting devices 2000 and 2100 according to the second embodiment shown in FIGS. 8 to 9 may be adopted.

Referring to FIG. 10, in a lighting device 2200 according to a modified example of the second embodiment, the lighting device 2200 may include a first reflective member 411 extending from the first reflective layer 410 and extending in a direction parallel to the upper surface of the circuit board 100 may be included.

The first reflective member 411 may be formed to extend from an end of the first reflective layer 410. The first reflective member 411 may be formed to protrude from an end of the first reflective layer 410 in a direction perpendicular to the first exit surface 313. The first exit surface 313 and the first reflective member 411 may not overlap in a vertical direction. The first reflective member 411 may be formed to extend in a parallel direction to the upper surface of the circuit board 100 from the first reflective layer 410 disposed in a region where the first exit surface 313 and the first inclined surface 312 are connected. The first reflective member 411 may be integrally formed with the first reflective layer 410, but is not limited thereto. The first reflective member 411 may be formed of the same material as the first reflective layer 410, but is not limited thereto.

Light emitted from the light emitting device 200 disposed in the first groove 310 is reflected by the first reflective layer 410 and proceeds to the upper portions of the resin layer 300 and the diffusion layer 500, or may proceed directly to the upper portion of the resin layer 300 and the diffusion layer 500 without being reflected by the first reflective layer 410. Since the intensity of light reflected by the first reflective layer 410 and the intensity of light directly transmitted from the light emitting device 200 without being reflected are different from each other, this causes deterioration of light uniformity. Accordingly, the first reflective member 411 may reflect the light directly transmitted from the light emitting device 200 or prevent it from proceeding directly from the light emitting device 200. At this time, since the first reflective member 411 extends from the end of the first reflective layer 410, the light uniformity is increased from the front outside the lighting device 1200, and prevents the light emitting device 200 recognized from the side surface of the lighting device, and thus the external image of the lighting device 1200 may be improved.

In addition to, in the same manner that the first reflective member 411 is disposed at the end of the first reflective layer 410, a second reflective member 421 to the seventh reflective member 471 may be disposed at the ends of the second reflective layer 420 to the seventh reflective layer 470. Accordingly, the light emitted from the light emitting device 200 disposed in each of the second groove 320 to the seventh groove 370 may be emitted to the outside by proceeding in the same manner as in the process in which the light emitted from the light emitting device 200 disposed in the each of the second groove 320 to the seventh groove 370 according to the basic example of the second embodiment proceeds.

Accordingly, in the lighting device 2200 according to a modification of the second embodiment, the lighting device 2200 prevents light from proceeding an upper portion of the resin layer 300 and the diffusion layer 500 on the adjacent region of the exit surfaces 313, 323, 333, 343, 353, 363, and 373 by the first reflective member 411 to the seventh reflective member 417, and proceeds a uniform surface light source, and prevents the lighting emitting device 200 from being recognized from the outside. In addition, the phosphor layer 210 is disposed under the reflective layer 400 formed on the inclined surfaces 312, 322, 332, 342, 352, 362, 372 to improve light extraction efficiency, and since the phosphor layer 210 is not visually recognized from the outside, the lighting device 2200 having an improved external image may be provided.

Figure 11:
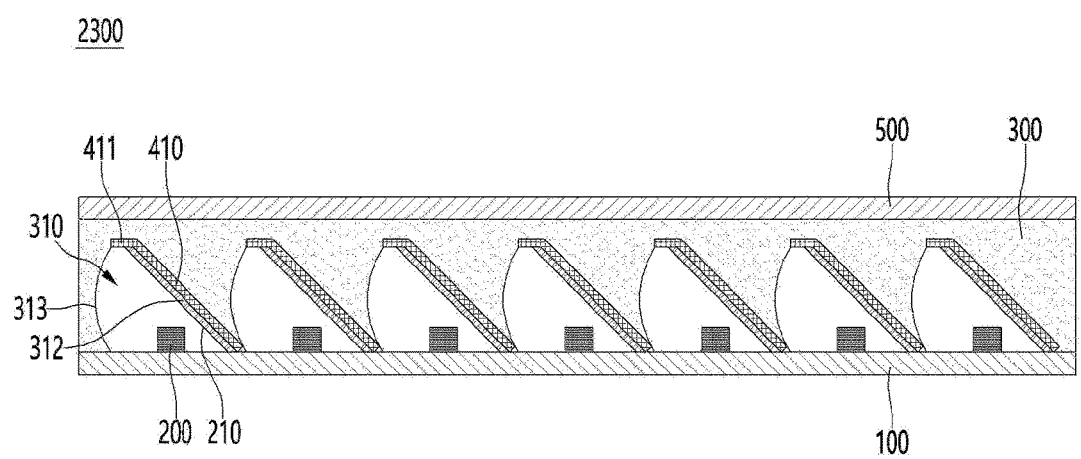
FIG. 11 is a cross-sectional view taken along line A-A' of a lighting device according to a modified example of the second embodiment.

FIG. 11 is a sectional view taken along line A-A' of a lighting device 2300 according to a modified example of the second embodiment. In FIG. 11, the contents previously described in the lighting devices 2000, 2100, and 2200 according to the second embodiment shown in FIGS. 8 to 10 may be adopted.

In the lighting device 2300 according to a modified example of the second embodiment, the exit surfaces 313, 323, 333, 343, 353, 363, and 373 of the plurality of grooves 310, 320, 330, 340, 350, 360, and 370 are formed concavely in the direction of the first side surface 1 from the second side surface 2 of the circuit board 100, and the lighting device 2300 may include reflective members 411, 421, 431, 441, 451, 461, and 471 extending from the reflective layer 400 in a direction parallel to the upper surface of the circuit board 100. At this time, the reflective members 411, 421, 431, 441, 451, 461, and 471 are different from the modified example of the first embodiment of FIG. 5, and may overlap the exit surfaces 313, 323, 333, 343, 353, 363, and 373 in the vertical direction. However, the phosphor layer 210 may not vertically overlap with the reflective members 411, 421, 431, 441, 451, 461, and 471 and the exit surfaces 313, 323, 333, 343, 353, 363, and 373.

Figure 12:
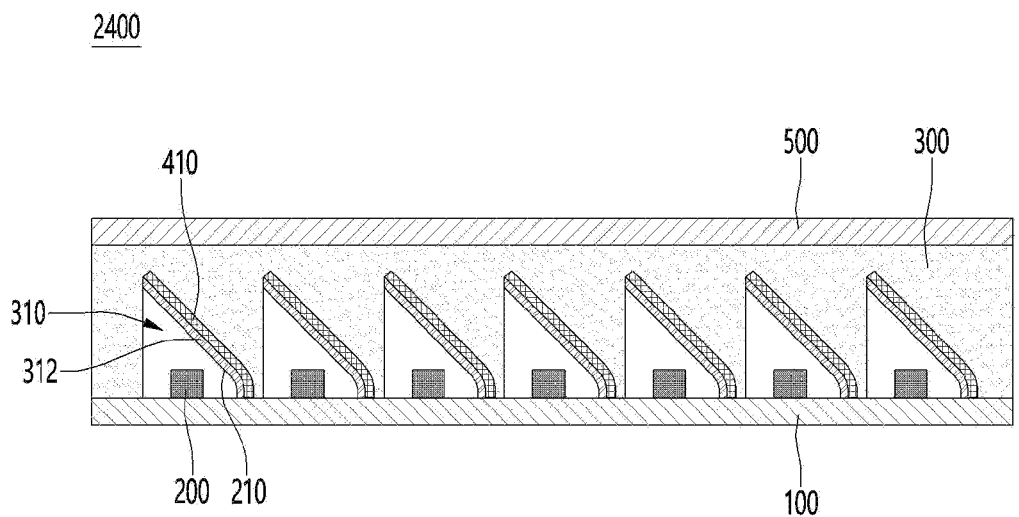
FIG. 12 is a cross-sectional view taken along line A-A' of a lighting device according to a modified example of the second embodiment.

FIG. 12 is a cross-sectional view taken along line A-A' of a lighting device 2400 according to a modified example of the second embodiment. In FIG. 12, the contents previously described in the lighting devices 2000, 2100, 2200, and 2300 according to the second embodiment shown in FIGS. 8 to 10 may be adopted.

Referring to FIG. 12, in the lighting device 2400 according to a modified example of the second embodiment, a portion of each of the inclined surfaces 312, 322, 332, 342, 352, 362, and 372 overlapping the light emitting device 200 disposed in each of the plurality of groove 310, 320, 330, 340, 350, 360, and 370 in the first direction X may be formed as curved surfaces. Accordingly, a portion of the reflective layer 400 formed in a region adjacent to the second exit surface 323 to the seventh exit surface 373 may be formed with a curved surface. Therefore, light emitted from the light emitting device 200 disposed in each of the plurality of grooves 310, 320, 330, 340, 350, 360, and 370 is not reflected upward by the curved reflective layer 400, and a hot spot phenomenon that may occur in a region adjacent to the second exit surface 323 to the seventh exit surface 373 may be prevented.

Figure 13:
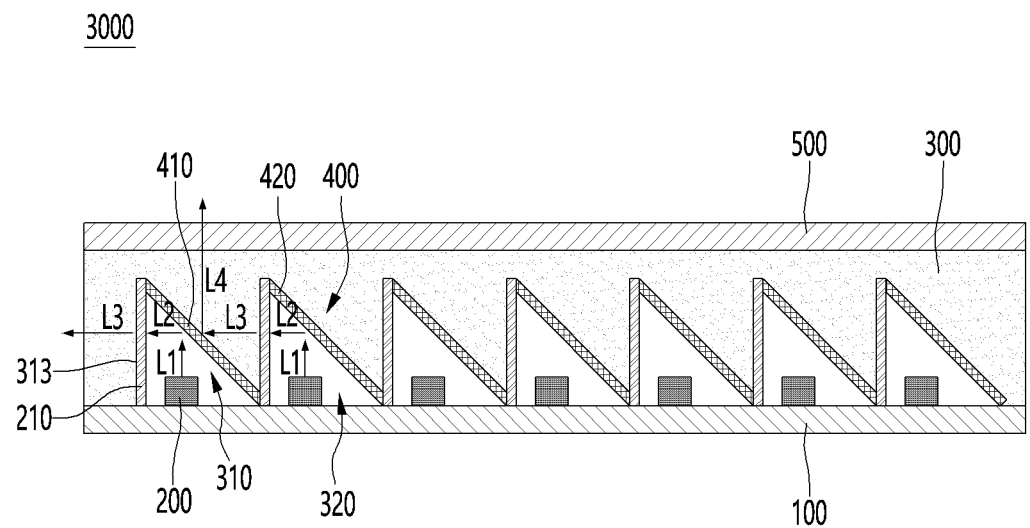
FIG. 13 is a cross-sectional view taken along line A-A' of the lighting device according to the third embodiment.

FIG. 13 is a cross-sectional view taken along line A-A' of the lighting device 3000 according to the third embodiment. In FIG. 13, the contents previously described in the lighting devices 1000, 1100, 1200, 1300, 1400, 2000, 2100, 2200, 2300, and 2400 according to the first and second embodiments shown in FIGS. 1 to 12 may be adopted Referring to FIG. 13, in the lighting device 3000 according to the third embodiment, a phosphor layer 210 is disposed to the exit surfaces 313, 323, 333, 343, 353, 363, and 373 of the plurality of grooves 310, 320, 330, 340, 350, 360, and 370.

A process in which light emitted from the light emitting device 200 disposed in the plurality of grooves 310, 320, 330, 340, 350, 360, and 370 travels to the upper portion of the resin layer 300 will be described.

For example, the first light L1 emitted from the light emitting device 200 disposed in the first groove 310 is directed toward the upper portion of the light emitting device 200 and may be reflect the second light L2 to the first exit surface 313 by the first reflective layer 410 formed on the first inclined surface 312. When the second light L2 is incident on the first exit surface 313, the second light L2 is converted into a third light L3 having a wavelength different from that of the second light L2 by the phosphor layer 210 formed on the first exit surface 313, and the third light L3 passing through the third exit surface 313 is diffused by the resin layer 300 disposed on the side surface of the first groove 310 and proceeds to the upper portion and the side surface of the resin layer 300, and may be emitted to the outside of the lighting device 2000.

In addition to, the first light L1 emitted from the light emitting device 200 disposed in the plurality of grooves $3n0$ ($n \geq 2$, n is an integer) except for the first groove 310 may travel an upwards of the light emitting device 200 and may be reflected in the direction of the n-th exit surface 323 by the n-th reflective layer $4n0$ formed on the n-th inclined surface $3n2$. The second light L2 incident on the n-th exit surface $3n3$ is converted into the a third light L3 having a different wavelength from that of the second light L2 by the phosphor layer 210 formed on the n-th exit surface $3n3$, and the third light L3 passing through the n-th exit surface $3n3$ may re-reflected in the upper direction of the resin layer 300 and the diffusion layer 500 by the (n−1)th reflective layer $4(n-1)0$ disposed adjacent to the n-th exit surface $3n3$ to emit a fourth light L4 having the same wavelength as the third light L3 to the outside of the lighting device 3000.

Accordingly, in the lighting device 3000 according to the third embodiment, the first light L1 emitted from the light emitting device 200 proceeds upward, and is reflected as the second light L2 toward the exit surfaces 313, 323, 333, 343, 353, 363, and 373 by the reflective layer 400 disposed on the inclined surfaces 312, 322, 332, 342, 352, 362 and 372 of the plurality of grooves 310, 320, 330, 340, 350, 360, 370, the second light L2 passing through the phosphor layer 210 disposed on the exit surfaces 313, 323, 333, 343, 353, 363 and 373 is converted in the third light L3 having a wavelength different from that of the second light L2, and the third light L3 is re-reflected by the adjacent reflective layer 400 and proceeds to the upper portion of the resin layer 300 and diffusion layer 500 as the fourth light L4, thereby emitting an uniform surface light source.

In addition, in the lighting device 3000 according to the third embodiment, the reflective layer 400 is formed on the inclined surfaces 312, 322, 332, 342, 352, 362, 372, respectively, and may overlap the light emitting device 200 in a vertical direction. Accordingly, since the light emitting device 200 is not visually recognized from the outside by the reflective layer 400, it is possible to prevent a hot spot from being generated by the light emitting device 200 when the lighting device is turned on.

Figure 14:
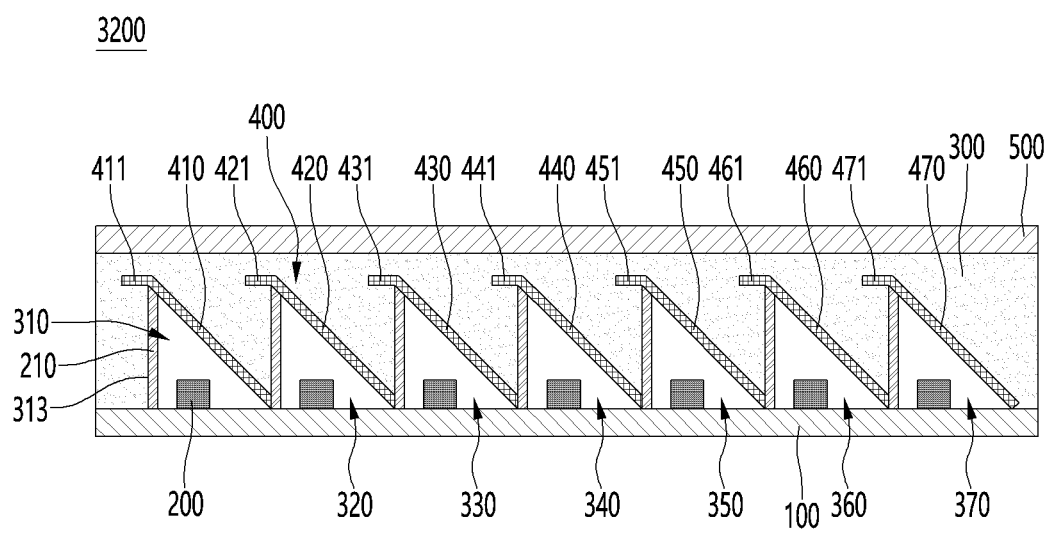
FIG. 14 is a cross-sectional view taken along line A-A' of a lighting device according to a modified example of the third embodiment.

FIG. 14 is a cross-sectional view taken along line A-A' of a lighting device 3100 according to a modified example of the third embodiment. In FIG. 14, the contents previously described in the lighting device 3000 according to the third embodiment shown in FIG. 13 may be adopted.

Referring to FIG. 14, in the lighting device 3100 according to a modified example of the third embodiment, the lighting device 3100 may include a first reflective member 411 extending from the first reflective layer 410 and extending in a direction parallel to the upper surface of the circuit board 100.

The first reflective member 411 may be formed to extend from an end of the first reflective layer 410. The first reflective member 411 may be formed to protrude from an end of the first reflective layer 410 in a direction perpendicular to the first exit surface 313. The first exit surface 313 and the first reflective member 411 may not overlap in a vertical direction. The first reflective member 411 may be formed to extend in parallel direction to the upper surface of the circuit board 100 from the first reflective layer 410 disposed on a region where the first exit surface 313 and the first inclined surface 312 are connected. The first reflective member 411 may be integrally formed with the first reflective layer 410, but is not limited thereto. The first reflective member 411 may be formed of the same material as the first reflective layer 410, but is not limited thereto.

Light emitted from the light emitting device 200 disposed in the first groove 310 is reflected by the first reflective layer 410 and proceeds to the upper portions of the resin layer 300 and the diffusion layer 500, or may proceed directly to the upper portions of the resin layer 300 and the diffusion layer 500 without being reflected by the first reflective layer 410. Since the intensity of light reflected by the first reflective layer 410 and the intensity of light directly transmitted from the light emitting device 200 without being reflected are different from each other, this causes deterioration of light uniformity. Accordingly, the first reflective member 411 may reflect the light directly transmitted from the light emitting device 200 or prevent it from proceeding directly the light emitting device 200. At this time, since the first reflective member 411 extends from the end of the first reflective layer 410 and prevents the light emitting device 200 recognized from the side surface of the lighting device, and thus the external image of the lighting device 1200 may be improved.

In addition to, in the same manner that the first reflective member 411 is disposed at the end of the first reflective layer 410, a second reflective member 421 to the seventh reflective member 471 may be disposed at the ends of the second reflective layer 420 to the seventh reflective layer 470. Accordingly, the light emitted from the light emitting device 200 disposed in each of the second groove 320 to the seventh groove 370 may be emitted to the outside by proceeding in the same manner as in the process in which the light emitted from the light emitting device 200 disposed in the each of the second groove 320 to the seventh groove 370 according to the basic example of the third embodiment proceeds.

Accordingly, in the lighting device 3100 according to the modified example of the third embodiment, the lighting device 3100 prevents light from proceeding an upper portion of the resin layer 300 and the diffusion layer 500 on the adjacent region of the exit surfaces 313, 323, 333, 343, 353, 363, and 373 by the first reflective member 411 to the seventh reflective member 417, and provides a uniform surface light source, and prevents the lighting emitting device 200 from being recognized from the outside. In addition, the phosphor layer 210 is disposed under the reflective member 401, 421, 431, 441, 451, 461, and 471, and since the phosphor layer 210 is not visually recognized from the outside, the lighting device 3100 having an improved external image may be provided.

Figure 15:
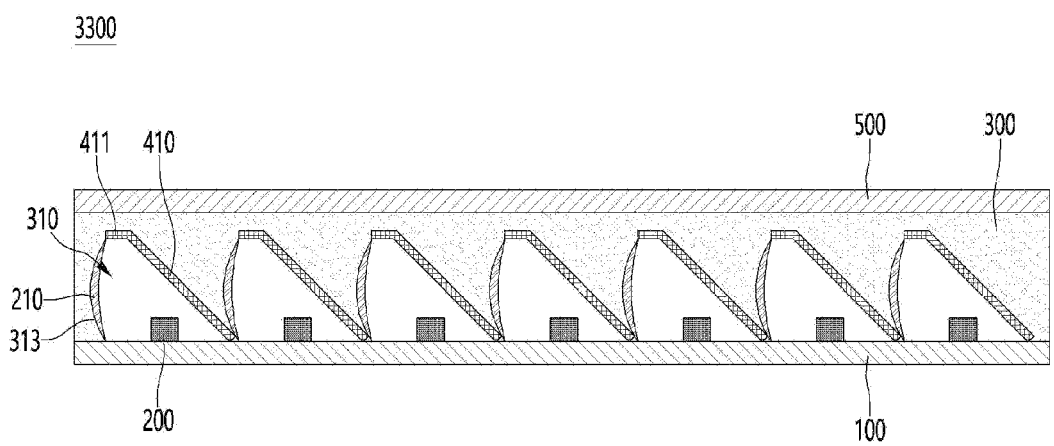
FIG. 15 is a cross-sectional view taken along line A-A' of a lighting device according to a modified example of the third embodiment.

FIG. 15 is a cross-sectional view taken along line A-A' of a lighting device 3200 according to a modified example of the third embodiment. In FIG. 15, the contents previously described in the lighting devices 3000 and 3100 according to the third embodiment shown in FIGS. 13 and 14 may be adopted.

Referring to FIG. 15, in the lighting device 3200 according to a modified example of the third embodiment, the first exit surface 313 of the first groove 310 is formed concavely in the direction of the first side surface 1 from the second side surface 2 of the circuit board 100. The first exit surface 313 may be formed in a concave lens shape, but is not limited thereto. In addition, the shape of the phosphor layer 210 may also be deformed according to the shape of the first exit surface 313.

Light emitted from the light emitting device 200 disposed in the first groove 310 is reflected by the first reflective layer 410 disposed on the light emitting device 200 to proceed to the first exit surface 313. In this case, since the first exit surface 313 has a concave lens shape, the efficiency of light passing through the first exit surface 313 may be increased.

In addition, the second exit surface 323 to the seventh exit surface 373 may be formed in the same shape as the first exit surface 313. Accordingly, the light emitted from the light emitting device 200 disposed in the second groove 320 to the seventh groove 370 may be emitted to the outside by proceeding in the same manner as in the process in which the light emitted from the light emitting device 200 disposed in the each of the second groove 320 to the seventh groove 370 according to the basic example of the third embodiment proceeds.

Therefore, in the lighting device 3200 according to the modified example of the third embodiment, since the exit surfaces 313, 323, 333, 343, 353, 363, and 373 and the phosphor layer 210 are formed in a concave lens shape, it is possible to provide a lighting device with improved light extraction efficiency.

Figure 16:
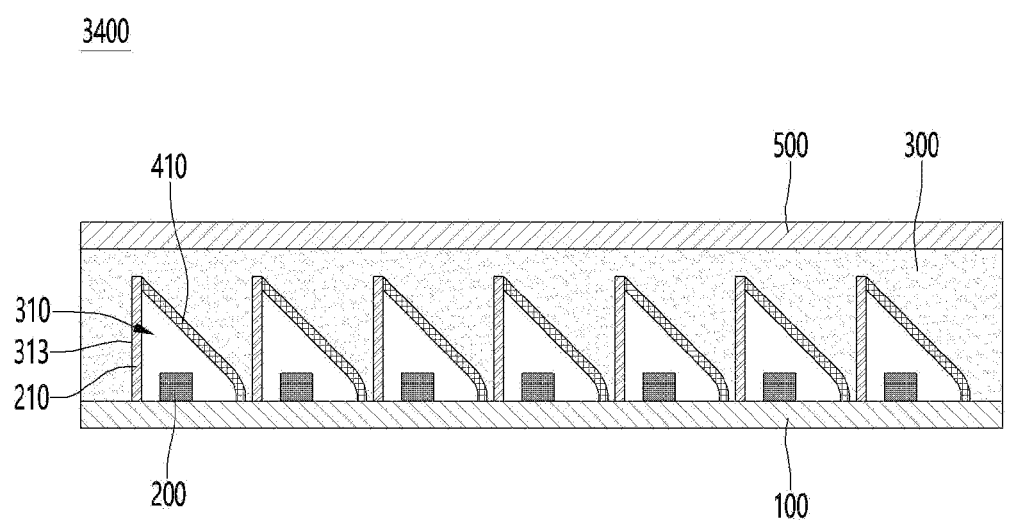
FIG. 16 is a cross-sectional view taken along line A-A' of a lighting device according to a modified example of the third embodiment.

FIG. 16 is a cross-sectional view taken along line A-A' of a lighting device 3300 according to a modified example of the third embodiment. In FIG. 16, the contents previously described in the lighting devices 3000, 3100, and 3200 according to the third embodiment shown in FIGS. 13 to 15 may be adopted.

As shown in FIG. 16, in the lighting device 3300 according to a modified example of the third embodiment, a portion of each of the inclined surfaces 312, 322, 332, 342, 352, 362, and 372 overlapping the light emitting device 200 disposed in each of the plurality of groove 310, 320, 330, 340, 350, 360, and 370 in the first direction X may be formed as curved surfaces.

Accordingly, a portion of the reflective layer 400 formed in a region adjacent to each of the second exit surface 323 to the seventh exit surface 373 may be formed with a curved surface. Therefore, light emitted from the light emitting device 200 disposed in each of the plurality of grooves 310, 320, 330, 340, 350, 360, and 370 is not reflected upward by the curved reflective layer 400, and a hot spot phenomenon that may occur in a region adjacent to the second exit surface 323 to the seventh exit surface 373 may be prevented.

Figure 17:
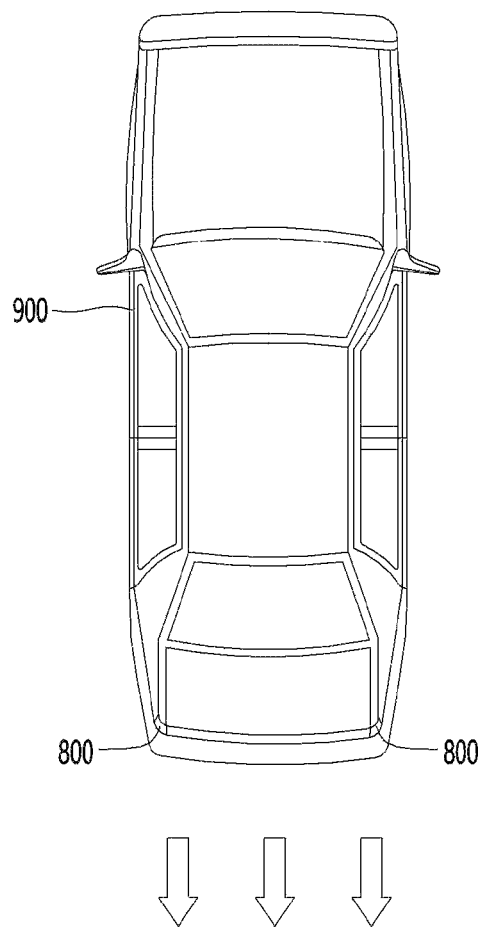
FIG. 17 is a plan view of a vehicle to which a lamp including a lighting device according to an embodiment is applied.
Figure 18:
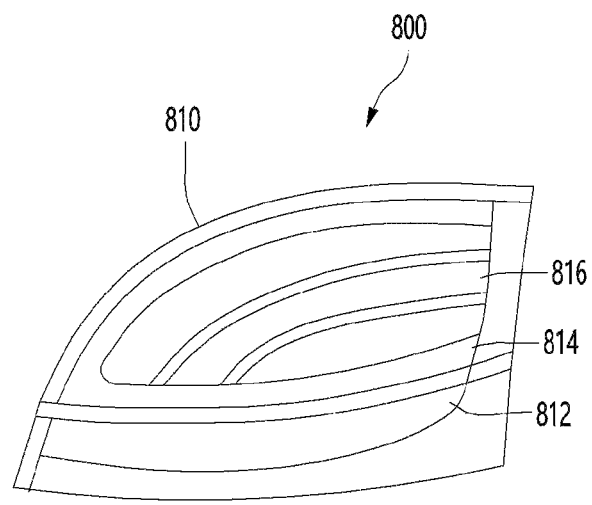
FIG. 18 is a diagram illustrating a lamp having a lighting device according to an embodiment.

FIG. 17 is a plan view of a vehicle to which a vehicle lamp to which a lighting module is applied according to an embodiment is applied, and FIG. 18 is a view showing a vehicle lamp having a lighting module or a lighting device disclosed in the embodiment.

Referring to FIGS. 17 and 18, the tail light 800 in the vehicle 900 may include a first lamp unit 812, a second lamp unit 814, a third lamp unit 816, and a housing 810. Here, the first lamp unit 812 may be a light source serving as a turn indicator, the second lamp unit 814 may be a light source serving as a sidelight, and the third lamp unit 816 may be a light source serving as a brake light, but is not limited thereto. At least one or all of the first to third lamp units 812, 814, and 816 may include the lighting module disclosed in the embodiment. The housing 810 accommodates the first to third lamp units 812, 814, and 816, and may be made of a light-transmitting material. At this time, the housing 810 may have a curve according to the design of the vehicle body, and the first to third lamp units 812, 814, and 816 may implement a surface light source that may have a curved surface according to the shape of the housing 810. Such a vehicle lamp may be applied to a turn signal lamp of a vehicle when the lamp unit is applied to a tail lamp, a brake lamp, or a turn signal lamp of a vehicle.

Features, structures, effects, and the like described in the embodiments above are included in at least one embodiment of the invention, and are not necessarily limited to only one embodiment. Furthermore, the features, structures, effects, and the like illustrated in each embodiment may be combined or modified for other embodiments by a person having ordinary knowledge in the field to which the embodiments belong. Accordingly, contents related to such combinations and modifications should be construed as being included in the scope of the invention.

In addition, although the examples have been described above, these are only examples and do not limit the invention, and those of ordinary skill in the field to which the invention pertains are illustrated above within the scope not departing from the essential characteristics of the present embodiment. It will be seen that various modifications and applications that have not been made are possible. For example, each component specifically shown in the embodiment can be modified and implemented. And differences related to these modifications and applications should be construed as being included in the scope of the invention defined in the appended claims.

The invention claimed is:

1. A lighting device comprising:
    a substrate including a first side surface and a second side surface opposite to the first side surface, a third side surface connecting the first side surface and the second side surface, and a fourth side surface opposite the third side surface;
    a resin layer having an upper surface and a bottom surface, and a plurality of grooves are formed in the resin layer such that each groove has an opening from the bottom surface, an exit surface extending from the bottom surface toward the upper surface, and an inclined surface inclined at a predetermined angle from a straight line passing through upper and lower ends of the exit surface, respectively, and the opening of each groove is to expose an upper surface of the substrate;
    a plurality of light emitting devices disposed on the substrate and inside each of the plurality of grooves and emitting a first light;
    a plurality of reflective layers disposed on each of the inclined surfaces of the plurality of grooves;
    a plurality of phosphor layers disposed on an upper surface of each of the light emitting devices or a lower surface of each of the reflective layers disposed on the inclined surfaces of the plurality of grooves; and
    a diffusion layer disposed on the upper surface of the resin layer;
    wherein each of the plurality of grooves is formed to extend toward the fourth side surface of the substrate and the plurality of grooves are arranged toward the second side surface from the first side surface of the substrate,
    wherein each of the plurality of light emitting devices, each of the phosphor layers, and each of the reflective layers in each of the plurality of grooves overlap in a vertical direction,
    wherein the plurality of grooves includes a first groove closest to the first side surface of the substrate and a second groove adjacent to the first groove,
    wherein a first light emitted from a light emitting device disposed in the second groove is converted by a phosphor layer of the second groove and is reflected by a reflective layer disposed on an inclined surface of the second groove, a light reflected by the reflective layer passes through a exit surface of the second groove, and a light passing through the exit surface of the second groove is reflected by a reflective layer disposed on an inclined surface of the first groove and passes through the resin layer and the diffusion layer.

2. The lighting device of claim 1,
    wherein each of the phosphor layers is disposed on the upper surface of each of the light emitting devices, and
    wherein each of the light emitting devices emits light through an upper surface and a plurality of side surfaces.

3. The lighting device of claim 1,
    wherein each of the phosphor layers is disposed on the lower surface of each of the reflective layers and is not visible from an outside.

4. The lighting device of claim 1,
    wherein each of the phosphor layers is formed on each of the exit surfaces of the plurality of grooves.

5. The lighting device of claim 1,
    wherein each of the exit surfaces in each of the plurality of grooves have a concave shape.

6. The lighting device of claim 4, comprising:
    wherein each of the reflective layers includes a reflective member extending in a direction parallel to the upper surface of the substrate from each of the reflective layers disposed on a region where each of the exit surfaces and each of the inclined surfaces are connected.

7. The lighting device of claim 6,
    wherein the first light emitted from the light emitting device disposed in the second groove is converted into second light having a wavelength different from that of the first light by the phosphor layer and the second light passes through the diffusion layer,
    wherein the phosphor layer disposed inside the second groove is disposed under a reflective member disposed inside the second groove.

8. The lighting device of claim 6,
    wherein the reflective member of each of the reflective layers protrudes from an upper end of each of the exit surfaces of each of the plurality of grooves toward a side surface of the resin layer adjacent to the first side surface of the substrate, and
    wherein a portion of the reflective member does not overlap each of the exit surfaces in the vertical direction.

9. The lighting device of claim 1,
    a portion of each of the inclined surfaces adjacent to the substrate is a curved surface.

10. The lighting device of claim 1,
    wherein light emitted from the light emitting device disposed in the first groove is emitted through the exit surface of the first groove and through a side surface of the resin layer,
    wherein a direction of light emitted from the light emitting device disposed in the first groove and passing through the resin layer is different from a direction of light emitted from the light emitting device disposed in the second groove and passing through the resin layer.

11. A lighting device comprising:
    a substrate including a first side surface and a second side surface opposite to the first side surface, a third side surface connecting the first side surface and the second side surface, and a fourth side surface opposite the third side surface;
    a resin layer having an upper surface and a bottom surface disposed on the substrate, and a plurality of grooves are formed in the resin layer;

a plurality of light emitting devices disposed on the substrate and disposed inside each of the plurality of grooves;

a reflective layer disposed in each of the plurality of grooves;

a phosphor layer disposed in each of the plurality of grooves; and a diffusion layer disposed on the resin layer;

wherein each of the plurality of grooves extends from the third side surface to the fourth side surface of the substrate, and is arranged toward the second side surface from the first side surface of the substrate, wherein each of the plurality of grooves is to expose part of an upper surface of the substrate, wherein each of the plurality of grooves having an opening from the bottom surface such that the upper surface of the substrate is exposed, an inclined surface facing the opening that provides the exposed upper surface of the substrate, and an exit surface connected between the bottom surface and the inclined surface, wherein the reflective layer is disposed on a surface of the inclined surface, wherein the phosphor layer extends from a first end of the reflective layer to a second end of the reflective layer, wherein the light emitting device, the phosphor layer and the reflective layer overlap in a vertical direction, wherein the exit surface of each of the plurality of grooves is disposed on a first side of each of the plurality of light emitting devices disposed in each of the grooves.

12. The lighting device of claim 11,
wherein each of the light emitting devices emits light through an upper surface and a plurality of side surfaces.

13. The lighting device of claim 11,
wherein the phosphor layer is disposed on an entire lower surface of the reflective layer, and is not visually recognized from a front of the lighting device.

14. The lighting device of claim 11,
wherein the phosphor layer is in contact with an end of the exit surface in each of the grooves.

15. The lighting device of claim 11,
wherein the exit surface in each of the grooves has a concave curved surface.

16. The lighting device of claim 14,
wherein the reflective layer includes a reflective member extending in a direction parallel to the upper surface of the substrate in a region where the end of the exit surface and an end of the inclined surface are connected in each of the plurality of grooves.

17. The lighting device of claim 16,
wherein the reflective member extends from the second end of the reflective layer into the resin layer.

18. The lighting device of claim 16,
wherein the reflective member of each of the reflective layers protrudes from the end of the exit surface of each of the plurality of grooves toward a side surface of the resin layer adjacent to the first side surface of the substrate.

19. The lighting device of claim 16,
wherein the reflective member does not overlap the exit surface in the vertical direction.

20. The lighting device of claim 16,
wherein a lower portion of the inclined surface faces a second side of the plurality of light emitting devices disposed in each of the plurality of grooves and has a curved surface.

* * * * *